(12) United States Patent
Robinson et al.

(10) Patent No.: US 7,130,327 B2
(45) Date of Patent: Oct. 31, 2006

(54) DIGITAL FREQUENCY SYNTHESIS

(75) Inventors: Ian Stuart Robinson, Venice, CA (US); Jeffrey Mark Hinrichs, San Diego, CA (US); Kenneth Weber, Redondo Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 328 days.

(21) Appl. No.: 10/608,926

(22) Filed: Jun. 27, 2003

(65) Prior Publication Data

US 2004/0264547 A1    Dec. 30, 2004

(51) Int. Cl.
*H04B 1/69* (2006.01)
*H04B 1/707* (2006.01)
*H04B 1/713* (2006.01)

(52) U.S. Cl. .................. 375/132; 375/131; 341/143
(58) Field of Classification Search ........... 375/132, 375/131; 341/143
See application file for complete search history.

(56) References Cited

U.S. PATENT DOCUMENTS

| | | | |
|---|---|---|---|
| 5,574,455 A * | 11/1996 | Hori et al. ............ | 341/144 |
| 5,598,440 A | 1/1997 | Domagala | |
| 5,859,605 A | 1/1999 | Raghavan et al. | |
| 6,047,018 A * | 4/2000 | Emi ................... | 375/135 |
| 6,075,474 A | 6/2000 | Gabet et al. | |
| 6,249,229 B1 * | 6/2001 | Eckstein et al. ...... | 340/572.4 |
| 6,437,718 B1 | 8/2002 | Oyama et al. | |
| 6,437,719 B1 | 8/2002 | Noro et al. | |
| 6,438,434 B1 | 8/2002 | Kamiya | |
| 6,480,129 B1 | 11/2002 | Melanson | |
| 6,498,535 B1 | 12/2002 | Allen et al. | |
| 6,683,905 B1 * | 1/2004 | King et al. .......... | 375/141 |
| 6,748,025 B1 * | 6/2004 | Hickling ............. | 375/316 |
| 2002/0063649 A1 * | 5/2002 | Viswanathan ......... | 341/147 |
| 2003/0067404 A1 * | 4/2003 | Ruha et al. .......... | 341/143 |
| 2003/0158721 A1 * | 8/2003 | Kato et al. ........... | 704/1 |
| 2003/0174026 A1 * | 9/2003 | Adachi et al. ........ | 332/117 |
| 2004/0192229 A1 * | 9/2004 | Morris et al. ........ | 455/91 |
| 2005/0062627 A1 * | 3/2005 | Jelonnek ............. | 341/143 |

FOREIGN PATENT DOCUMENTS

| | | |
|---|---|---|
| JP | 2002-519924 T2 | 7/2002 |
| WO | WO 98/33137 | 7/1998 |
| WO | WO 00/01072 | 1/2000 |

OTHER PUBLICATIONS

Yunfeng Liang, and Yong Lian, "A 250MHz CMOS Bandpass Delta Sigma Modulator Using Continuous-Time Resonator Structure (Short Paper)", date unknown.

(Continued)

*Primary Examiner*—Jean B. Corrielus
*Assistant Examiner*—Erin M. File
(74) *Attorney, Agent, or Firm*—Tarolli, Sundheim, Covell & Tummino LLP

(57) ABSTRACT

Frequency synthesis is implemented by providing a delta-sigma modulated signal associated with a selected frequency, which frequency can vary based on a selection input. The delta-sigma modulated signal is converted from the digital to analog domain. The delta-sigma modulated signal can be provided directly from memory based on the selection input or, alternatively, it can be provided by a signal generator and processed by a delta-sigma modulator to provide the delta-sigma modulated signal. The selected frequency can be varied at a high rate of speed.

26 Claims, 7 Drawing Sheets

OTHER PUBLICATIONS

European Search Report completed Jan. 29, 2004.
Dufort B et al: "Signal Generation using Periodic Single and Multi-Bit Sigma-Delta Modulated Streams" Proceedings of the International Test Confrerence. ITC '97. Washington, DC. Nov. 1-6 1997. International Test Conference, New York, NY: IEEE, US, vol. CONF. 28, Nov. 1, 1997, pp. 396-405, XP000800336 ISBN: 0-7803-4210-0 *figure 6B*.

M. Bellanger; "*A DSP Perspective of Sigma-Delta Techniques and Applications in Communications*"; 1995 International Symposium of Signals, Systems and Electronics; pp. 195-198.

US 6,496,127, 12/2002, Olson et al. (withdrawn)

* cited by examiner

FREQUENCY (MHz)

DIGITAL FREQUENCY SYNTHESIS

TECHNICAL FIELD

The present invention relates generally to signal processing, and more particularly to a system and method for synthesizing digital signals.

BACKGROUND OF THE INVENTION

Efforts in the design of integrated circuits for radio frequency (RF) communication systems generally focus on improving performance, reducing cost or a combination thereof. One area of particular interest relates to frequency synthesis. Presently there are two main approaches to frequency synthesis, one being analog, the other being primarily digital.

The analog approach generally employs a phase-locked loop (PLL) that provides a desired frequency signal based on a comparison of the output of a voltage-controlled oscillator (VCO) with a defined phase of a reference signal. Error correction is implemented in response to errors associated with the output of the PLL. A phase frequency detector can detect errors and adjust the output to a desired carrier frequency. This approach further employs a loop containing a PLL and a programmable divide-by-N upconverter that multiplies the stable frequency. A loop filter is typically utilized to help suppress spurious signals so as to mitigate undesired frequency modulation in the VCO. PLL-based frequency synthesizers generally have a noise level inversely proportional to the interval required to slew and settle to a new (tuned) frequency. As a result, use of PLL-based synthesizers in fast-hopping systems requires compromises.

The other main type of frequency synthesizer is a direct digital synthesizer (DDS). The DDS approach generally employs logic and memory components to digitally construct a desired output signal. A digital-to-analog converter (DAC) converts a corresponding digital output signal to the analog domain. Consequently, the DDS generally is restricted to operate within frequencies supported by the DAC. Additionally, this type of synthesizer tends to be limited in spur size, as the linearity of multi-bit DACs is limited and degrades as the operating speed increases

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates generally to frequency synthesis. The frequency synthesis is implemented by providing a delta-sigma modulated signal associated with a selected frequency. The delta-sigma modulated signal is converted from the digital to analog domain. The delta-sigma modulated signal can be provided directly based on a selection input or, alternatively, it can be provided by a signal generator and processed by a delta-sigma modulator to provide the delta-sigma modulated signal.

According to one implementation of the present invention, memory can be used to store a plurality of frequency patterns for a set of frequencies. The patterns can be stored as delta-sigma modulated patterns for the set of frequencies. Alternatively, the stored patterns can represent other (e.g., non delta-sigma modulated) types of waveforms (e.g., sine waveforms) for the set of frequencies.

A frequency synthesizer implemented in accordance with an aspect of the present invention can also be employed to provide a local oscillator signal based on an analog output signal of the synthesizer for a desired carrier frequency. For example, a data signal can be mixed with the local oscillator signal for upconversion or down conversion of the data signal.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF INVENTION

The present invention relates generally to a frequency synthesis approach that can be implemented to provide a frequency source with low noise and fast tuning speed in a cost efficient manner. The frequency synthesis is implemented by providing a delta-sigma modulated signal associated with a selected frequency, which frequency can vary based on a selection input. The delta-sigma modulated signal is converted from the digital to analog domain. The delta-sigma modulated signal can be provided directly based on the selection input or, alternatively, it can be provided by a signal generator and processed by a delta-sigma modulator to provide the delta-sigma modulated signal.

Figure 1:
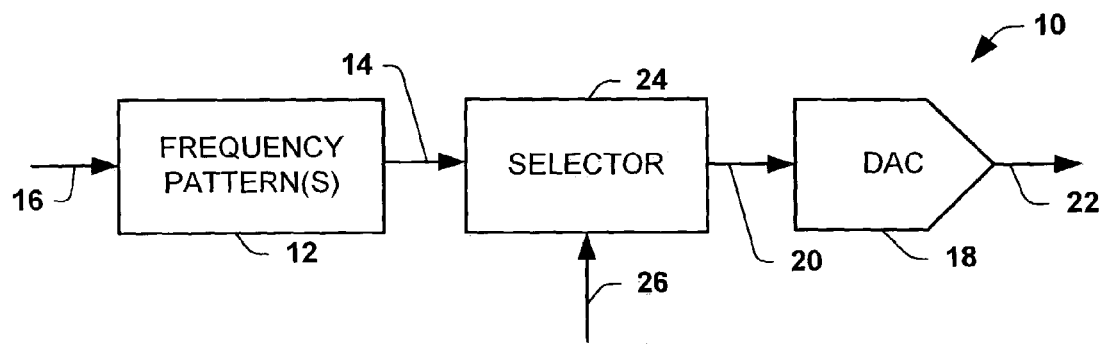
FIG. 1 is a schematic block diagram depicting a frequency synthesizer in accordance with an aspect of the present invention.

FIG. 1 illustrates a block diagram of the system 10 operative to synthesize signals at selected frequencies in accordance with an aspect of the present invention. The system 10 includes a source of one or more frequency patterns, indicated schematically at 12. The source 12 is operative to provide a selected frequency output signal 14 as a function of a frequency selection signal 16. The frequency patterns can be sine waves or other waveform patterns. The selected frequency pattern 14 can be provided as a one-bit or multi-bit data stream, such as depending on system configuration and application requirements.

The selection signal 16 contains a digital value that is associated with or maps to a corresponding frequency pattern. Those skilled in the art will understand and appreciate various mapping schemes and standards that can be employed to elicit desired frequency patterns from the source 12 based on the selection signal 16.

According to one aspect of the present invention, the source 12 can include memory (not shown) that stores digital representations of analog signal patterns having a predetermined duration (or length) for each of the desired frequencies. Those skilled in the art will understand and appreciate in applications where it may be suitable to employ a set of pre-stored frequency patterns in the source 12, the frequency patterns can be programmed offline for use during normal operation of the system 10.

A memory device utilized to store the frequency patterns should be capable of storing a sufficient amount of data for the set of patterns for a given application. By way of particular example, for certain wireless communication applications that utilize frequency hopping, such as Global System for Mobile (GSM) communications, a stored digital representation of a frequency pattern having an interval length of about 0.5 milliseconds is appropriate. The memory device should also be able provide the signal at a sufficient sample rate according to the frequency being provided and application in which the system 10 is being implemented. For example, the source 12 can employ a memory having an operating speed that depends on the size (number of bits) in the output signal 14. In this way, less expensive circuitry can be utilized for the source, where a greater number of bits are provided in the data stream corresponding to the selected pattern. Alternatively, the source 12 can be implemented as a digital signal processor (DSP) or other similar device capable of generating a digital representation of a signal having a desired frequency based on the selection signal 16. This approach allows any frequency to be used rather than a pre-stored set of frequency patterns.

Those skilled in the art will understand and appreciate that the present invention is not limited to any particular communications scheme. For example, it can be used to generate signals for Enhanced Data Rates for Global Evolution (EDGE), wideband code division multiple access (WCDMA), orthogonal frequency division multiplexing (OFDM) and the like. Additionally, a frequency synthesizer implemented according to an aspect of the present invention is not limited to communications applications, as it can be used in any application where it is desired to selectively hop frequencies at a known interval. The hop rate can be fixed or variable, depending on the application, for example.

The system 10 also includes a DAC 18 operative to convert a digital input waveform 20 into a corresponding analog output signal 22. In accordance with an aspect of the present invention, the input waveform 20 is a delta-sigma modulated waveform associated with the selected frequency to drive the DAC 18. The waveform 20 can be one-bit or multi-bit data depending, for example, on the desired output frequency and performance requirements. The source 12 can provide the frequency patterns as either digital sine waveforms or delta-sigma modulated sine waveforms. In either case, the input signal 20 to the DAC 18 is a, possibly oversampled, quantized data stream having the number of bits corresponding to the configuration of DAC 18.

The DAC 18 can be a one-bit DAC or a multi-bit DAC operative to convert the digital input signal 20 to the analog signal 22. Those skilled in the art will appreciate that a one-bit DAC is generally capable of outputting signals at rates well above and as substantially purer waveforms than conventional multi-bit DACs. For example, because a multi-bit DAC has more than two output levels (as in a one-bit DAC), there is a greater tendency of errors associated with the mismatch of output levels adding impurities or noise into the analog output signal 22. A one-bit DAC, however, can provide the analog signal 22 as a substantially pure sine waveform at a desired output frequency.

By way of example, where the selected frequency pattern 14 is provided as a multi-bit data stream, the source 12 providing the frequency pattern can operate at a slower clock rate than the DAC 18, such that the relative clock rates are proportional to the number of bits at such stages. The system 10 can include a selection system 24, such as a switching network or multiplexer, where the source 12 provides frequency pattern 14 as multi-bit data. The system 24 is operative to modify the multi-bit data stream 14 to a desired number of one or more bits corresponding to the data stream 20 and at a desired sample rate according to a control input signal 26. By way of particular example, the source 12 can provide the data stream 14 as an N-bit data stream and the switching system 24 can convert the N-bit data stream to an M-bit data stream as the input signal 20 to the DAC 18, where N and M are positive integers and N>M≧1. The sample rate of the M-bit data stream can be functionally related to the number of bits N and M and the desired output frequency of the signal at 22.

Those skilled in the art will understand and appreciate various approaches to multiplexing and selecting an appropriate frequency pattern that can be utilized in accordance with an aspect of the present invention. Alternatively, the source 12 can be programmed and/or configured to provide the data stream 14 with an appropriate number of bits and desired sample rate directly to the DAC 18. In this case, the signals 14 and 20 would be the same without an intermediate selector system 24.

Figure 2:
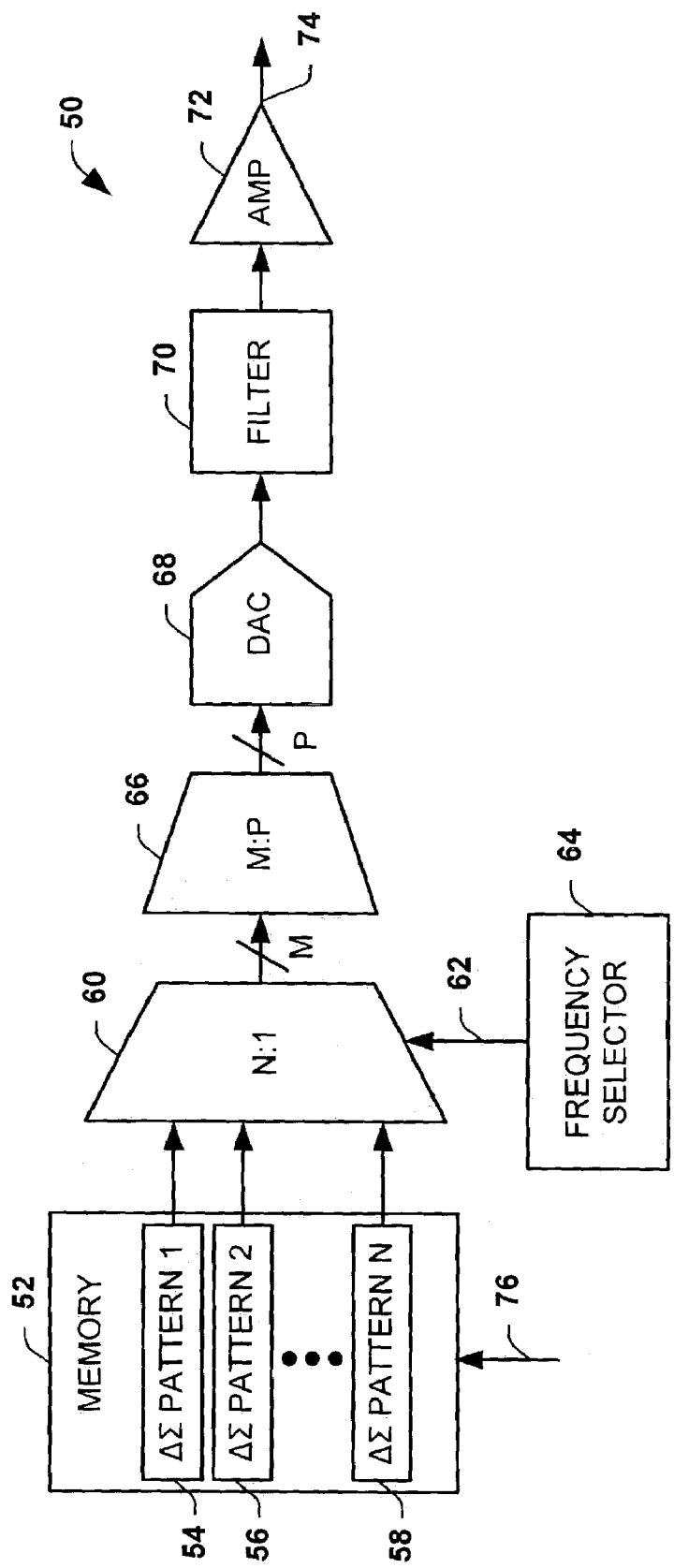
FIG. 2 is a schematic block diagram depicting a delta-sigma frequency synthesizer system implemented in accordance with an aspect of the present invention.

FIG. 2 is an example of another frequency synthesis system 50 that can be implemented in accordance with an aspect of the present invention. The system 50 includes a memory 52 that stores plurality of predetermined signal patterns 54, 56, and 58. While for purposes of simplicity of illustration three such patterns are depicted in FIG. 2, it is to be understood that any number of N patterns can be used, where N is a positive integer (N≧1) and denotes the number of represented frequencies. The memory 52 can be volatile memory (e.g., RAM and the like) or non-volatile memory (e.g., ROM, FLASH, EPROM and the like). Those skilled in the art will understand and appreciate various data structures and memory configurations that can be utilized to store the signal patterns according to an aspect of the present invention.

In this example, the signal patterns 54–58 are delta-sigma modulated signal patterns associated with the N respective frequencies. For example, each of the patterns 54–58 is stored as a multi-bit pattern corresponding to a frequency signal (e.g., a sine wave) having a predetermined duration or tone length. The duration and the number of bits that are required for storing each frequency pattern 54–58 are determined as a function of the application in which the frequency synthesizer 50 is being implemented.

By way of particular example, for GSM applications the delta-sigma modulated patterns 54–58 can be derived from 0.5 millisecond sine waveforms generated at each of the N frequencies. The sine waves at each of the N frequencies are delta-sigma modulated, with the corresponding delta-sigma modulated data being stored in the memory 52 as the patterns 54–58. Because the delta-sigma modulation of the respective sine waveforms can be implemented off-line (e.g., either by the system 50 or by another system operative to program the memory 52), higher order delta-sigma modulation can be utilized than could be implemented for real-time frequency synthesis. By increasing the order of delta-sigma modulator, improved noise characteristics can be achieved in the resulting stored patterns so as to mitigate noise content in frequency synthesis.

A selection system 60 is coupled to the memory 52 for selecting a desired one of the signal patterns 54–58 from the memory 52. For example, the selection system 60 includes a multiplexer having N inputs and operative to obtain a selected one of the frequency patterns 54–58 from an associated memory location as a function of a selection signal 62. The selection signal 62 can be provided by a frequency selector 64. Those skilled in the art will understand and appreciate various types of frequency selection mechanisms that can be utilized to identify a desired carrier frequency in accordance with an aspect of the present invention. While the frequency selector 64 and multiplexer 60 are depicted in FIG. 2 as being external to the memory 52, it will be appreciated that the frequency selection function alternatively could be implemented as computer-executable instructions within the memory 52.

For the example of a baseband-to-RF conversion scenario, in frequency synthesis for GSM applications, the frequency patterns 54–58 can correspond to frequencies ranging from about 925 MHz to about 960 MHz at an interval of about 200 KHz. The frequency selector 64 thus is operative to provide the selection signal 62 to select a desired one of the frequencies in the frequency range. In this approach, the frequency selector 64 can be programmed and/or configured to provide the signal 62 as a digital output that controls the selection system (e.g., multiplexer) 60 to select one of the frequency patterns 54–58 associated with a desired frequency in the desired bandwidth being implemented in the system 50. Those skilled in the art will understand and appreciate that the number of bits in the frequency selection signal 62 generally will depend on the number N of patterns and the type of selection system 60 being utilized.

The selection system 60 can provide a selected one of the stored delta-sigma patterns 54–58 to an associated multiplexer 66 as a function of the selection signal 62. The selected signal pattern can be provided by the selector system 60 as an M-bit data stream, where M is a positive integer greater than or equal to one. The multiplexer 66, which is optional, is operative to combine the M-bit output from the selection system 60 into a P-bit data stream, where P is a positive integer and $M \geq P \geq 1$. That is, the multiplexer 66 operates as a rate controller to facilitate accessing the frequency patterns 54–58 as large word sizes from the memory 52. The P-bit data stream thus comprises an over sampled quantized data stream, which the multiplexer 66 provides to a DAC 68.

Those skilled in the art will understand and appreciate that less expensive circuitry (e.g., operating at slower clock speeds) can be utilized for the memory 52 where a larger number of M bits are provided in the data stream corresponding to the selected signal pattern. Alternatively, where the memory 52 and selection system 60 are capable of operating at sufficiently high sample rates, the multiplexer 66 can be omitted and the selected delta-sigma modulated pattern can be provided directly to the DAC 68 according to an aspect of the present invention.

In accordance with an aspect of the present invention, the DAC 68 is a one-bit DAC and thus the multiplexer 66 is an M:1 multiplexer (i.e., P=1). In wireless communication applications, for example, a one-bit DAC is capable of providing a substantially pure tone at a higher sample rate relative to comparably priced multi-bit DACs. For example, a one-bit DAC presently can operate at speeds of about 4 GHz and thus is capable of providing analog output signal directly at a desired transmission frequency (e.g., up to about 3 GHz) without requiring additional upconversion. Such a DAC can provide analog output signals at other lower frequency ranges (e.g., in the MHz frequency range). For wireless commercial applications, systems and methods according to an aspect of the present invention will enable wide bandwidth, high dynamic range, and linearity for multi-carrier transmit modules for various wireless system standards.

During normal operation, for example, the memory 52 and selection system 60 can operate at a clock speed of $F_s/M$, where $F_s$ is the sample clock rate. The multiplexer 66 and the DAC 68 can operate at the sample clock rate $F_s$ to facilitate providing the analog output from the DAC at a desired carrier, as indicated by the selection signal 62.

The DAC 68 provides the corresponding analog signal to a filter 70. For example, the filter 70 can be a bandpass, high pass or low pass filter, depending on the particular application in which the system 50 is being utilized. That is, the filter 70 can be a bandpass filter, such as a surface acoustic wave (SAW) filter or other device. The filter 70 is operative to mitigate quantization noise and noise that has been shifted or shaped to out-of-band frequencies by delta-sigma modulation that resulted in the respective signal patterns 54–58. In this way, the filter 70 is capable of providing a substantially pure signal (e.g., tone) having a substantially low noise floor.

The filter output signal can be provided to an amplifier 72 operative to amplify the selected signal pattern to a desired level for additional processing. The amplifier 72 provides an amplified output signal at 74. For example, the amplified signal at 74 can be provided as a local oscillator signal to a mixer such that the signal operates as a carrier frequency for transmission of a wireless communication signal. Alternatively, the amplified output signal at 74 can be employed as a local oscillator signal for down converting a signal in a receiver portion of a communication system. Thus, by changing the selection signal 62 at a desired hop rate, the system 50 can frequency hop to provide low noise signals for use in numerous frequency hopping applications.

Figure 3:
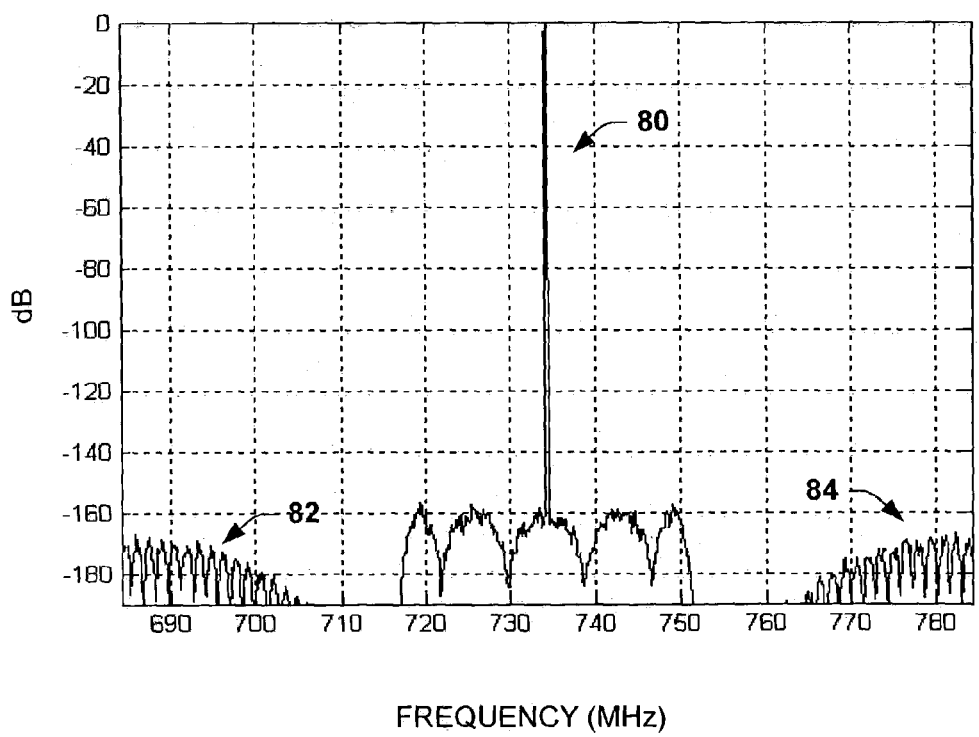
FIG. 3 depicts a frequency spectrum for an analog signal generated by a frequency synthesizer in accordance with an aspect of the present invention.

FIG. 3 illustrates an example of a frequency spectrum 80, which can be provided using frequency synthesis in accordance with an aspect of the present invention. For example, the spectrum 80 corresponds to a signal that has been filtered (e.g., through a SAW bandpass filter) to mitigate out-of-band frequency content and noise. Thus, as depicted in FIG. 3, the tone is substantially pure for in band frequencies and the signal has a low noise floor for both lower and higher out-of-band frequencies, as indicated respectively at 82 and 84. The particular spectrum 80 depicted in FIG. 3 corresponds to a wideband code division multiple access (WCDMA) signal. Those skilled in the art will appreciate that the approach in FIGS. 1 and 2 can be adapted for use in other communication standards. Examples of such other standards include GSM, Enhanced Data Rates for Global Evolution (EDGE), orthogonal frequency division multiplexing or multiple access (OFDM) and the like.

Figure 4:
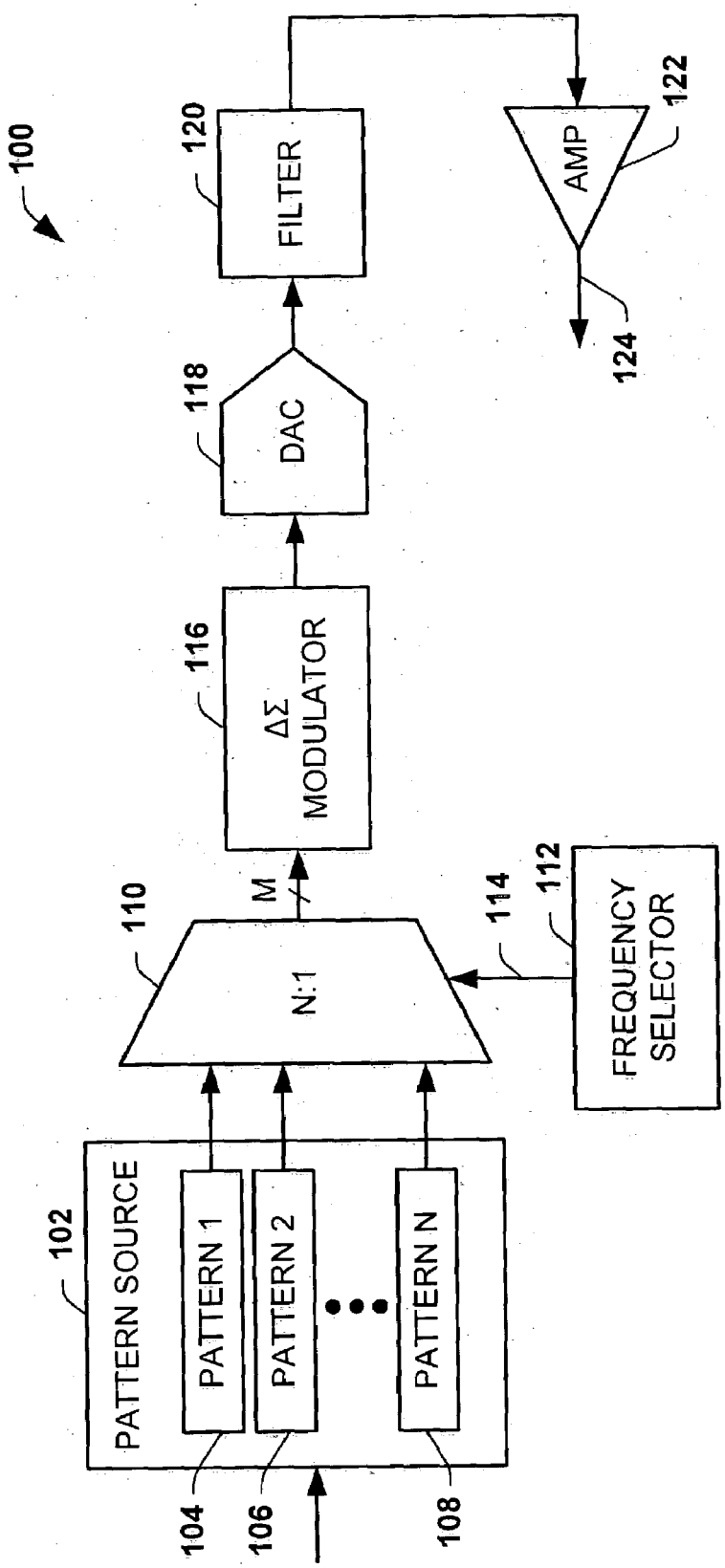
FIG. 4 is a schematic block diagram depicting another frequency synthesizer system implemented in accordance with an aspect of the present invention.

FIG. 4 is an example of another digital synthesizer system 100 in accordance with an aspect of the present invention. The system 100 is similar to the system 50 shown and described with respect to FIG. 2. Briefly stated, the system 100 includes a memory 102 that stores a plurality of N predetermined signal patterns 104, 106, and 108, where $N \geq 1$. The signal patterns 104–108 can be stored as digital representations of corresponding analog signal patterns that have been generated for a predetermined duration at desired frequencies. Alternatively, the signals can be generated digitally, such as with a baseband modulator, DSP or other signal generator device. The frequency patterns 104–108 can be spaced over a desired frequency range, such as at fixed or variable intervals between adjacent frequencies. It is to be understood and appreciated that any set of frequencies, which can be related or unrelated, can be stored in the memory 102 for use in the system 100 according to an aspect of the present invention.

A switch system 110, such as a multiplexer, is associated with the memory 102 for selecting a desired one of the N frequency patterns 104–108. A frequency selector 112 provides a selection signal 114 for controlling which of the N patterns is to be provided to an associated delta-sigma modulator 116. The selected pattern can be provided as an M-bit data stream, where $M \geq 1$. Those skilled in the art will understand and appreciate various types of frequency selection mechanisms that can be utilized to select a desired carrier frequency in accordance with an aspect of the present invention. For example, the frequency selection function can be implemented as hardware, software or a combination thereof. In one particular example, the frequency selection can be computer-executable instructions implemented in the memory 102.

The delta-sigma modulator 116 is programmed and/or configured to process a selected one of the signal patterns to provide a high dynamic range quantized data stream having a predetermined number of bits for driving an associated DAC 118 at a desired sample rate. The output data stream may be oversampled to provide a higher dynamic range. Those skilled in the art will understand and appreciate various approaches that can be utilized to implement a digital delta-sigma modulation in accordance with an aspect of the present invention. By way of example, the delta-sigma modulator 116 includes a digital filter configured to perform unsampling, noise shaping and quantization on the selected frequency pattern. The delta-sigma modulator 116 provides a quantized output signal that typically has a reduced number of bits per sample when compared to the input signal 104, but at a faster sample rate than the multi-bit input.

The DAC 118 converts the delta-sigma modulated data stream into a corresponding analog signal having a desired frequency as defined by the selected pattern. The DAC 118 can be a one-bit or multi-bit DAC. A one-bit or low multi-bit DAC for converting a data stream can facilitate providing the analog output at a desired frequency, such as can be in the GHz or upper MHz range. For example, the DAC 118, delta-sigma modulator 116 and switch system can be configured from SiGe, InP or other high-speed integrated circuit technologies. The delta-sigma modulator 116 is configured to provide a data stream having an appropriate number of bits according to the DAC 118 being utilized.

The DAC 118 provides the analog output signal having the desired frequency to a filter 120. Where the system 100 is implemented within transmitter circuitry, the DAC 118 can provide the analog signal directly at a desired transmission frequency according to an aspect of the present invention. In this way, no additional analog upconversion is required prior to transmission of the filtered signal, and the system can provide a substantially pure carrier signal that can be mixed with desired data for subsequent transmission. Alternatively, the system 100 could be implemented in conjunction with receiver circuitry or other devices requiring substantially pure signals that can hop to desired frequencies according to a hop rate for such applications.

The filter 120 can be a bandpass filter, such as a SAW filter or other device. Other types of filters also could be utilized, including lumped element and the like. The filter 120 is operative to mitigate quantization noise and noise that has been shifted or shaped to out-of-band frequencies by the delta-sigma modulation implemented by the modulator 116.

The filter output signal can be passed to an amplifier 122 operative to amplify the selected signal pattern to provide an output signal 124 at a desired level. For example, the amplified signal care be provided as a local oscillator signal to drive a mixer such that the signal operates as a carrier frequency for transmission of wireless communication signals or for up or down conversion in a transceiver.

Figure 5:
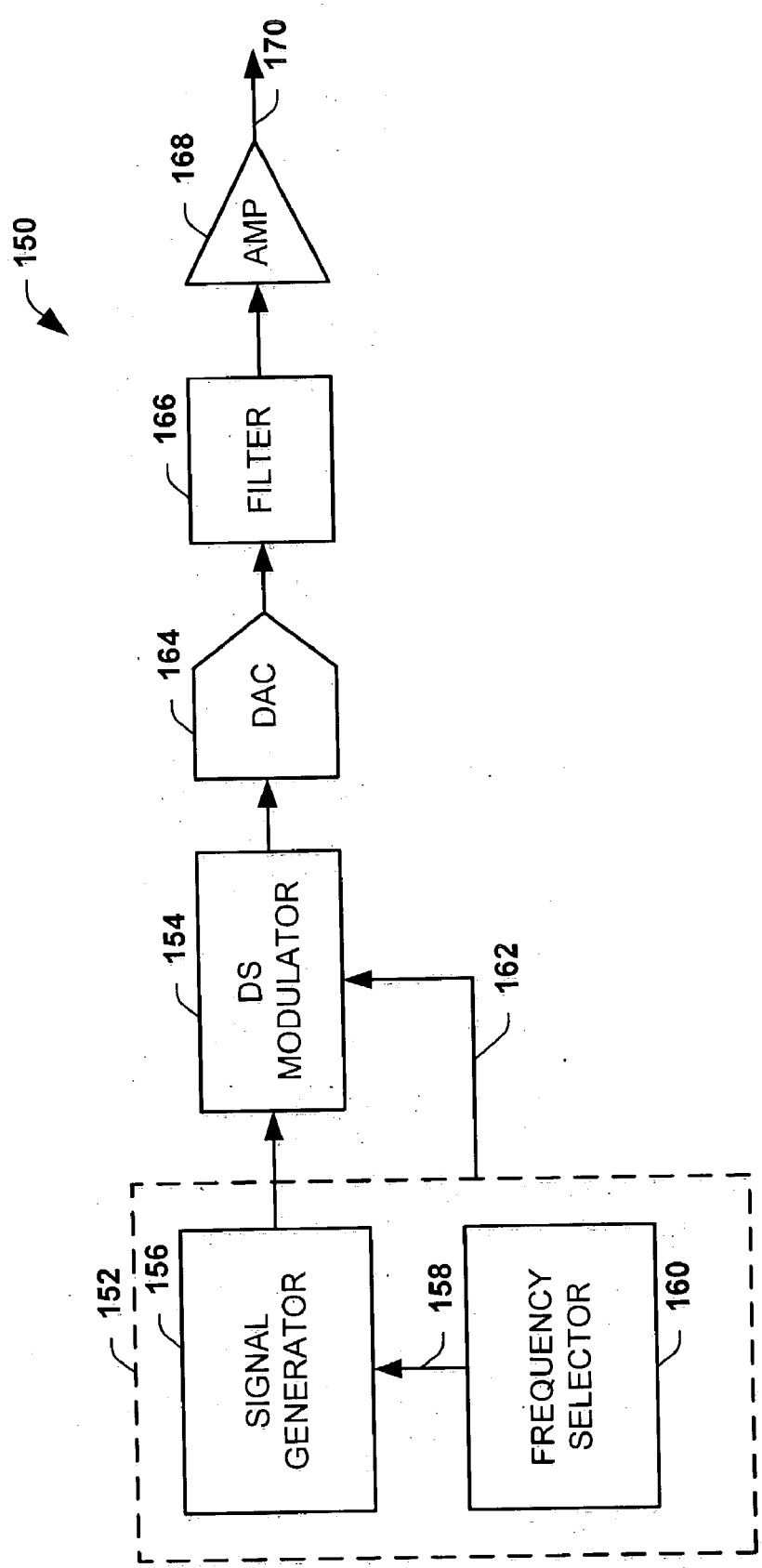
FIG. 5 is a schematic block diagram depicting yet another frequency synthesizer system implemented in accordance with an aspect of the present invention.

FIG. 5 is an example of a direct digital synthesizer 150 that affords additional frequency flexibility in accordance with an aspect of the present invention. The system 150 includes a signal generation system 152 that provides a desired signal pattern to an associated delta-sigma modulator 154. The system 152, for example, includes a signal generator component 156 that is operative to provide the desired signal pattern to the delta-sigma modulator 154. The signal generator component 156 provides the desired signal pattern for a selected frequency based on a frequency selection signal 158. In this example, a frequency selector component 160 provides the frequency selection signal 158 to the signal generator 156 for selecting the desired carrier. The frequency selector 160 is operative to change the selection signal 158 at an associated hop rate. By changing the selection signal, the generator 156 provides different signal patterns, which enable the system 150 to frequency hop at a desired rate. The hop rate can thus be set according to the application in which the system 150 is being implemented.

Those skilled in the art will understand and appreciate that system 152 can be implemented as part of a DSP or similar functioning device. For example, the functions of the signal generator and frequency selector components 156 and 160 can be computer-executable instructions implemented by an associated processor (not shown). In this example, the signal generation system 152 provides flexibility for frequency selection. That is, the selected patterns need not be limited to a predetermined stored set of frequencies since the signal generation system 152 can source other frequencies according to an aspect of the present invention.

Where frequency flexibility is desired, the delta-sigma modulator 154 should be capable of performing noise shaping and quantization for the frequency of the signal received from the signal generator 156. Thus, the system 152 can provide a control signal, indicated at 162, to adapt the delta-sigma modulator 154 according to the frequency being synthesized. This enables the delta-sigma modulator 154 to appropriately shift noise to out-of-band frequencies based on the selected frequency. By way of example, such an approach can be implemented by utilizing plural delta-sigma modulators, with different ones being operative to perform suitable noise-shaping and quantization for different frequencies or corresponding frequency ranges. Alternatively, the filtering characteristics of the delta-sigma modulator 154 can be programmable or tunable to accommodate the frequency of the signal being generated. In order to improve the cost effectiveness of such an approach, it is desirable to utilize a low-cost implementation for the delta-sigma modulator 154 that can accommodate frequency hopping (see, e.g., FIG. 6).

The remainder of the system 150 is substantially similar to that shown and described with respect to FIG. 4. The DAC 164 provides the analog output signal to an associated filter 166. The filter 166 is configured to remove out-of-band frequency components and quantization noise, including that resulting from the processing by the delta-sigma modulator 154. The filtered signal is then amplified to a desired level by an amplifier 168 that provides the corresponding analog output signal 170 at an appropriate level.

Figure 6:
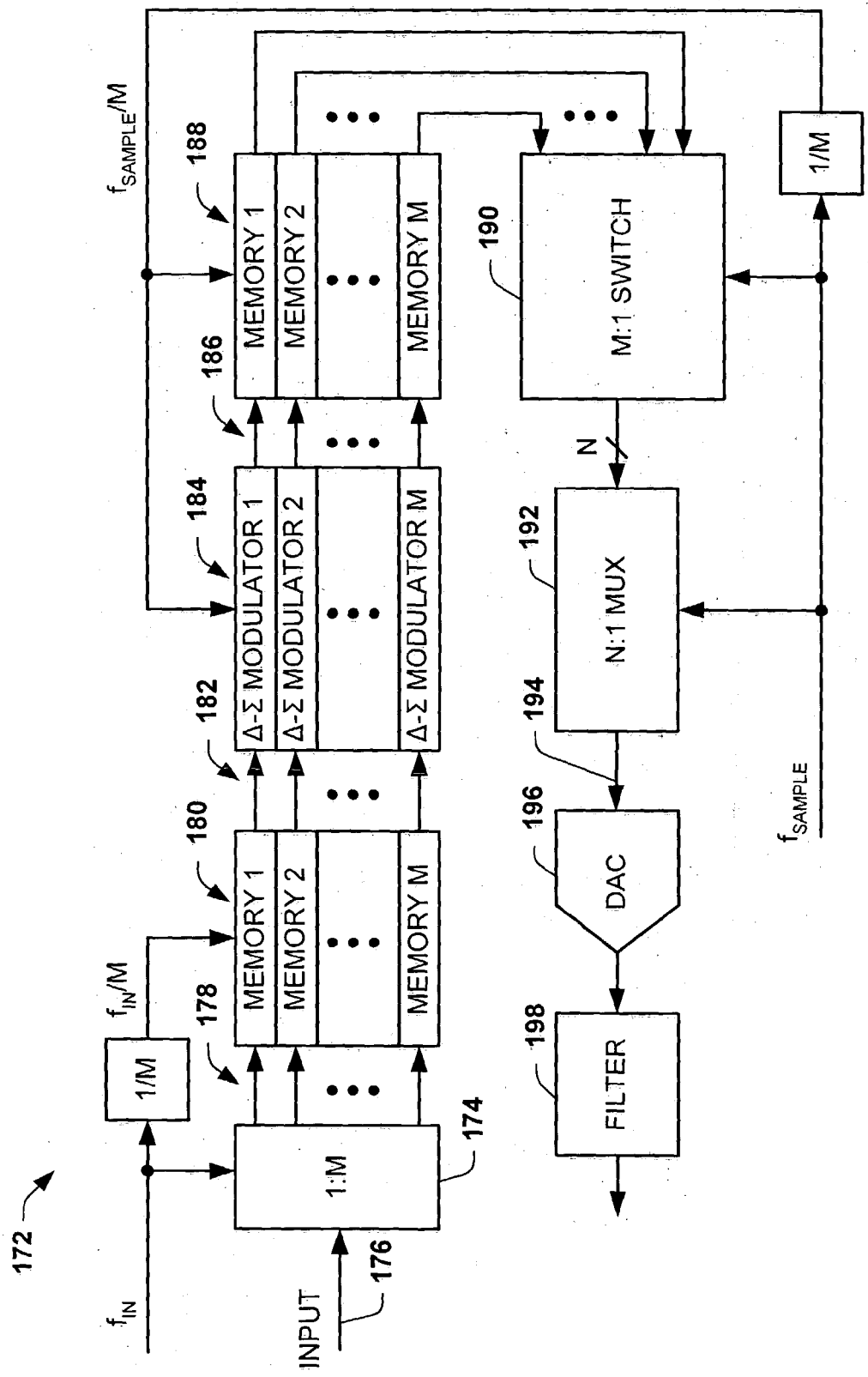
FIG. 6 is an example of a delta-sigma modulator that can be utilized in a frequency synthesizer in accordance with an aspect of the present invention.

FIG. 6 depicts an example of one type of delta-sigma modulator system 172 that can be implemented in accordance with an aspect of the present invention. This type of delta-sigma is especially useful for frequency hopped systems where there is a "dead-time" between hops. Those skilled in the art will appreciate other low-cost delta-sigma modulators that can be utilized in accordance with an aspect of the present invention.

In this example, the system 172 includes a switching system 174, such as a de-multiplexer, that receives a digital input signal 176. A baseband modulator or DSP (not shown) or suitable memory can be programmed and/or configured to provide the input signal 176 according to the desired frequency generation scheme. The switching system 174 separates (e.g., samples) portions of the input signal into M respective data segments 178 having a predetermined number of bits that are provided to an associated memory system 180. The number of bits for each data segment 178 can vary according to, among other things, the application of the frequency synthesizer 172, the rate of the digital input signal and based on the number M of parallel paths. For the particular example of GSM time-division multiple access (TDMA), the switching system 174 can sample the input signal over an interval for a TDMA time slot or "burst" (e.g., about one-half millisecond) to respective memory sections 1 through M.

The memory system 180 includes memory buffers (e.g., M memory sections) sufficient to store the respective data segments 178 from the switching system 174. The memory system 180 operates as parallel rate buffers to facilitate a decrease in the data rate of the input signal 176 from an input data rate. A parallel delta-sigma modulator network 184 thus reads buffered data segments 182 from the memory system 180 at a lower data rate than the sample rate of the input signal 176. For example, where the input signal 176 is sampled at a rate of $f_{IN}$, each of the M parallel delta-sigma modulators can sample the respective buffered segments 60 at $f_{IN}/M$.

The network 184 includes M delta-sigma modulators arranged in parallel, (indicated as ΔΣ MODULATOR 1 through ΔΣ MODULATOR M). Each of the delta-sigma modulators processes the input data segments 182 by performing a noise shaping function and quantization. Each of the delta-sigma modulators provides a quantized digital representation of a respective buffered data segment, indicated collectively at 186, which is stored in buffer memory 188. The buffer memory 188 can be read out at a high rate such that the subsequently filtered output of the DAC 196 can provide a desired frequency without requiring any additional analog mixing or frequency conversion.

For example, each delta-sigma modulator can provide a one-bit stream of quantized data into the buffer memory 188 at a desired sample rate, which can be greater than or equal to the sample rate of the input signal 176. The output sample rate of the quantized data 186 can be selected to be functionally related to a desired high-speed sample rate $f_{SAMPLE}$, such as inversely proportional to the number of parallel stages, namely $f_{SAMPLE}/M$.

Those skilled in the art will understand and appreciate that the parallel arrangement of delta-sigma modulators 184 operating at slower, more conventional speeds provides an acceptable approximation of a comparable high-speed delta sigma modulator in accordance with an aspect of the present invention. Because such an approximation can be implemented using conventional CMOS technology and achieve comparable performance to that provided by high speed, more expensive delta-sigma technology, a significant cost savings can be achieved according to an aspect of the present invention. The cost savings is realized because, even though additional hardware may be needed to construct the network 184 than, CMOS is less expensive to employ and has a substantially higher yield than comparable high speed alternative technologies. Alternatively, higher cost and faster technologies, such as SiGe and InP, can also be utilized to provide the parallel delta-sigma modulator network and, thereby achieve even higher sample rates.

It will be understood and appreciated that any number M of parallel delta-sigma modulator stages can be utilized in accordance with an aspect of the present invention. The number of stages for a given application will generally result from a balancing of the clock rates for the stages relative to the amount of hardware for the modulator network and the required size of the memory buffer 180.

For wireless applications, those skilled in the art will understand and appreciate that delta-sigma modulation generally requires high clock rates (e.g., greater than 1 GHz for this application). Generating a local oscillator at such a high frequency with very low noise (e.g., less than about 140 dBc/Hz) may become prohibitively expensive, for example, due to higher cost and lower yields associated with high-speed technologies, such as SiGe and InP. By employing a parallel arrangement of lower speed (e.g., CMOS) delta-sigma modulators 184 to approximate a higher-speed delta-sigma modulator, the system 172 provides a low cost solution to improve overall performance that can be implemented using readily available and accepted CMOS technology Referring back to FIG. 6, the memory 188 includes M memory sections, each receiving and buffering oversampled quantized data 186 from a respective one of the M parallel delta-sigma modulators. It will be appreciated that less than M memory sections alternatively could be utilized by enabling selected delta-sigma modulators to share memory sections. However, those skilled in the art will appreciate that where the delta-sigma modulators and memory 188 are fabricated using low cost technology (e.g., CMOS), the incremental cost associated with providing additional CMOS memory locations or other CMOS structures is sufficiently low to warrant their use.

An M:1 switch system 190, such a multiplexer, can be clocked at $f_{SAMPLE}$ to read the quantized data from the memory buffer 188 and provide a corresponding N-bit stream, where N is a positive integer greater than or equal to one. The switch system 190, for example, cycles through the M buffer sections in a desired order to provide the N-bit stream. The output of the memory buffer 188 can be provided to an optional high speed multiplexer 192 to control the rate of the output data stream 194.

For the example where the delta-sigma modulator 172 provides the output signal 194 to a one-bit DAC 196, the multiplexer 192 converts the N bit input to a one-bit output 194 at the desired sample rate $f_{SAMPLE}$. Alternatively, the multiplexer 192 could provide the output signal 194 at other bitwidths according to the DAC 196. The rate $f_{SAMPLE}$ can be any rate greater than the Nyquist rate, such as proportional to the center frequency $f_{CENTER}$ of a selected frequency signal (e.g., $2^k \times f_{CENTER}$, where k is at least 2), as provided in the input signal 176. The multiplexer 192 provides the one-bit output 194 as an oversampled, quantized data stream. Those skilled in the art will appreciate that the output data stream 194 can be provided to accommodate the particular input requirements of any DAC being utilized, such as where a multi-bit DAC 196 is being utilized. The analog output signal from the DAC 196 is provided to a filter 198 to remove out-of-band signal content and noise.

To achieve higher output frequencies, the multiplexer 192 and subsequent DAC 196, for example, can be implemented using high-speed technology (e.g., SiGe or InP) operating at the desired sample rate $f_{SAMPLE}$. This enables the DAC to provide the analog output directly at the selected frequency without requiring additional upconversion. It is to be understood and appreciated that instead of employing both multiplexers 190 and 192, a single multiplexer (or other switching system) operating at the desired sample rate could be utilized to multiplex the oversampled, quantized data from the buffer memory 188 to provide a desired one-bit or other low-bit output signal 194.

The parallel arrangement utilized in the delta-sigma modulator 172 can be optimized for frequency hopped systems. By matching the length of the memory elements 180 to the time each frequency is used, the transient error due to the parallel approximation of a single delta-sigma modulator can occur in between frequency bursts. As a result, such a system can be implemented using lower cost technologies without a noticeable degradation in performance.

Figure 7:
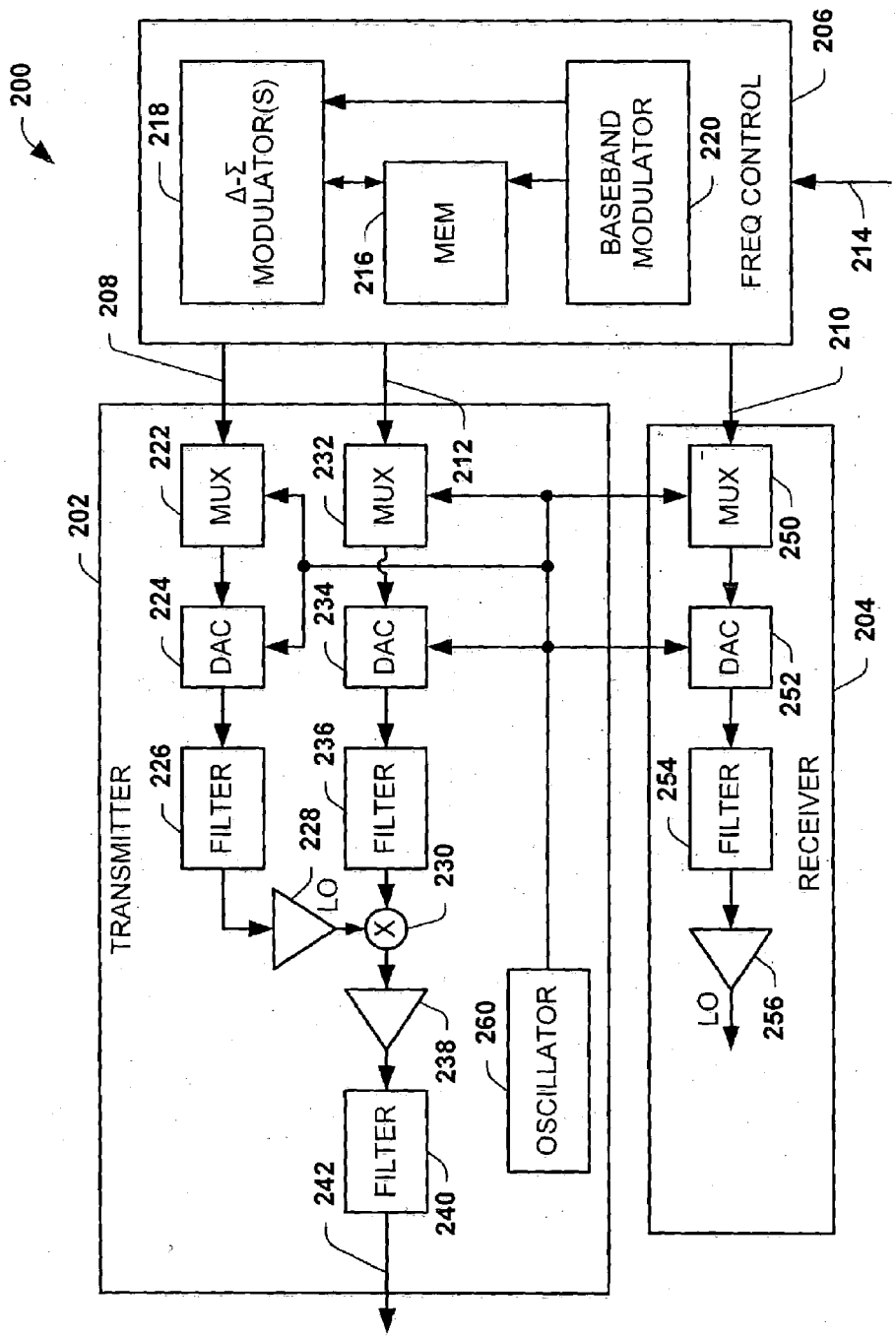
FIG. 7 is an example of a communications system that can be implemented in accordance with an aspect of the present invention.

FIG. 7 depicts an example of a communication system 200 that can be implemented in accordance with an aspect of the present invention. In this example, the system 200 is depicted as a transceiver that includes a transmitter module 202 and a receiver module 204. A frequency control module 206 is operative to supply desired waveforms for processing by the respective transmitter and receiver portions 202 and 204. Each of the respective modules 202, 204, and 206 can be implemented as different circuit boards, for example, employing one or more integrated circuits. Those skilled in the art will appreciate that separate transmitters and receivers also can be implemented in accordance with an aspect of the present invention.

By way of example, in many prior art systems, the receiver and transmitter would each require one or more local oscillators (two each for a frequency hopped system using a ping-pong synthesizer to achieve fast settling time) to provide frequency conversion. In FIG. 7, a single fixed oscillator is used to create the frequency hopped signals needed for frequency conversion of both receive and transmit signal chains. The frequency control module 206 is operative to provide selected frequency patterns 208 and 210 to the respective transmitter and receiver modules 202 and 204. The module 206 also provides a data signal 212 to the transmitter module 202, which corresponds to the data that is to be modulated onto a desired carrier. The module 206 provides such signals 208, 210 and 212 based on one or more input signals, schematically indicated at 214. The one or more signals 214, for example, can include clock signals, burst information and/or frequency information for a given signal that is to be transmitted or has been received for additional processing. Thus, the signal 214 can control frequency hopping characteristics for the modules 202 and 204. The hopping characteristics can include a hop rate, which can be fixed or variable over the associated frequency range.

In accordance with an aspect of the present invention, the module 206 includes memory 216 that is operative to store a plurality of signal patterns for each of a plurality of desired frequencies. In accordance with an aspect of the present invention, the signal patterns in the memory 216 can be stored as delta-sigma modulated frequency patterns. Alternatively, the patterns can be stored as digital representations of other types of frequency patterns that have not been delta-sigma modulated (e.g., conventional sine waves).

In the approach where delta-sigma modulated frequency patterns are stored in the memory 216, for example, the memory 216 can be operative to provide the signals 208 and 210 to the respective transmitter and receiver modules 202 and 204 based on the one or more input signals 214. In this way, the module 206 can provide a desired delta-sigma modulated frequency pattern associated with a selected frequency based on the input signal 214. The memory 216 is designed to be enable frequency hopping at a hop rate depending on the application and standard being implemented by the communications system 200. The time to access and provide a selected pattern from the memory usually will be within the latency typically associated with frequency hopping applications.

The module 206 can also include a delta-sigma modulator 218 in accordance with an aspect of the present invention. The function of the delta-sigma modulator 218 can vary depending upon the approach implemented to provide and hop frequencies during system operation.

For example, in certain applications, it may be desirable to store digital representations of sine waves or other types of waveforms in the memory 216. The memory 216 is then operative to provide a selected frequency pattern to the delta-sigma modulator 218 based on the one or more input signals 214. The delta-sigma modulator 218 performs desired noise shaping and quantization on the selected frequency pattern from the memory 216 to result in one or both of the delta-sigma modulated signal patterns at 208 or 210.

Alternatively, if more frequency flexibility is desired, a baseband modulator (or other computing apparatus) 220 can implement real time processing and provide a desired baseband signal at a desired carrier frequency, such as a function of the one or more input signals 214. The baseband modulator 220 can provide the corresponding signal to the delta-sigma modulator 218, which in turn generates one or both of the signals 208 and 210. Alternatively, or additionally, the delta-sigma modulated data generated in response to the digital frequency signal provided by the baseband modulator 220 can be stored in the memory 216. In this way, a more expansive and adaptable frequency library can be obtained and be made available for future use. Further, the frequency generation and corresponding delta-sigma modulation can be run as an offline process to store desired delta-sigma modulated frequency patterns in the memory 216. The offline process can be implemented in a separate programming mode (e.g., apart from normal communications by the system 200) or such offline process can occur concurrently with such normal operation (e.g., as a background process).

In accordance with another aspect of the present invention, the baseband modulator 220 can cooperate with the memory 216 and the delta-sigma modulator 218 to program a set of desired frequencies that can be provided during normal operation. The process of programming the memory 216 can be implemented, for example, in an off-line process to generate and store delta-sigma modulated frequency patterns in the memory for a desired set of frequencies. The programming process is controlled to provide frequency patterns (in the digital domain) for each of a plurality of frequency patterns to the delta-sigma modulator 218, For example, a controller (not shown) can, selectively cause the baseband modulator 220 to generate the set of frequencies in a desired sequence. The baseband modulator 220 provides each frequency pattern to the delta-sigma modulator 218. Each of these frequency patterns can have a predetermined duration associated with the particular application and communication protocol in which the system 200 is implemented.

The delta-sigma modulator 218 performs noise shaping and quantization on each of the respective signals from the baseband modulator 220 and provides corresponding delta-sigma modulated frequency patterns to the memory 216 for storage. In this way, the memory 216 can be programmed as a look-up table or otherwise operative to provide selected delta-sigma modulated frequency pattern based on a corresponding input signal 214 during normal operation. By operating in this manner, the module 206 provides a flexible solution in which the system 200 can accommodate various different frequency ranges, which can be programmed by the user. Those skilled in the art will further appreciate that an off-line signal generation and programming process enables higher order (e.g., more difficult to implement in real-time) delta-sigma modulation to be utilized, which can improve the purity of frequency content in the signal patterns stored in the memory 216 from that typically achievable in an real-time process.

Turning to the contents of the transmitter module 202, the frequency control module 206 provides the waveform 208 to a multiplexer 222. As mentioned above, the waveform 208 corresponds to digital delta-sigma modulated signal pattern at a selected frequency. The multiplexer 222 aggregates the multi-bit waveform 208 to provide a waveform having fewer bits to an associated DAC 224. Alternatively, the multiplexer 222 could be omitted and the frequency control module 206 provide the waveform 208 with a number of one or more bits according to the capacity of the DAC 224. The DAC 224, which can be a one-bit DAC or a multi-bit DAC, converts the delta-sigma modulated waveform into a corresponding analog output signal.

An analog filter 226 removes quantization noise and noise that has been shifted to out-of-band frequencies in the analog signal, such as noise due to delta-sigma modulation of the selected signal pattern. The filter 226 can be a bandpass, high pass or low pass filter, depending on the particular application and delta-sigma modulator design. The filter 226 thus can provide a substantially pure signal (e.g., tone) having a substantially low noise floor to an associated optional low noise amplifier 228. The amplifier 228 amplifies the analog frequency pattern to a desired level to provide a local oscillator signal (LO) to a mixer 230. That is, the signal provided to the mixer 230 corresponds to a LO signal at a desired carrier frequency as selected by the one or more input signals 214 to the module 206.

The mixer 230 is operative to upmix a desired data signal to the carrier frequency defined by the LO signal. Because the waveform 208 comprises delta-sigma modulated waveform data for a desired frequency, the mixer 230 can upmix a data stream to the selected frequencies (e.g., in the upper MHz or GHz range) with reduced noise content relative to upmixing systems using conventional local oscillators, especially noise levels close to the carrier frequency. Additionally, because the local oscillator signal is derived from baseband delta-sigma frequency patterns, which can be stored patterns or generated on-line, frequency hopping can be achieved with very fast settling times.

The data signal, which the mixer 230 combines with the LO signal, is derived based on the data signal 212 provided by the frequency control module 206. In particular, the transmitter module 202 also includes circuitry to process the signal 212. For example, such circuitry includes another multiplexer 232 that receives the data signal 212 from the frequency control module 206. The multiplexer 232 modifies the data stream to provide a data stream with an appropriate number of bits to a DAC 234. The DAC 284 converts the data stream to a corresponding analog signal at an intermediate frequency (IF), for example. A filter (e.g., a narrow band SAW) 236 filters the signal and provides the IF signal to the mixer 230. The mixer 230 produces an aggregate signal by combining the IF signal with the LO carrier signal provided by amplifier 228.

The mixer 230 provides the aggregate signal to another amplifier 238, which is then filtered by a filter 240. The filter 240, for example is a wideband SAW filter that optimizes the bandwidth and helps eliminate unwanted out-of-band emissions and errors, such as may result from the upmixing. The filter 240 provides the filtered RF output 242 for further amplification and transmission. Those skilled in the art will understand and appreciate that such a local oscillator system enables support over any desired transmission frequency range.

The receiver module 204 also is operative to generate a local oscillator (LO) signal for use in the receiver portion. For purposes of simplification, the receiver module 204 represents only the LO generation portion of the receiver. In particular, the delta-sigma modulated frequency pattern 210 is provided to a multiplexer 250 to modify the signal to a data stream having a desired number of bits. The modified data stream is provided to a DAC 252, which converts the data stream to a corresponding analog signal. A filter 254 performs desired filtering on the analog signal by removing out-of-band components and noise, such as resulting from delta-sigma modulation associated with the pattern 210. The filter 254 provides a filtered signal to an amplifier 256 resulting in a desired amplified LO signal at a desired carrier frequency. For example, the amplifier 256 can provide the LO signal for downconversion in the receiver module 204.

In the example of FIG. 7, a single oscillator 260 is may be utilized to drive at least portions of both the receiver and transmitter modules 202 and 204 even though they may both be hopping rapidly in frequency. This obviates the need for multiple tunable oscillators, conventionally implemented with multiple voltage controlled oscillators. For example, the clock defines the sample rates for the DACs 224, 234, and 252 and multiplexers 222, 232 and 250 in the receiver and transmitter modules 202 and 204. The oscillator 260 can be implemented as a crystal oscillator or other suitable frequency source that generates a desired clock signal. The clock signal can be N times the sample rate of the data streams 208, 210 and 212 provided by the frequency control module 206, where N is the number of bits in the respective data streams (N≧1). This enables the circuitry (e.g., the frequency control module 206) that provides the delta-sigma waveforms for the selected frequencies to operate at slower sample rates than the latter portion of the local oscillator systems (e.g., the DACs 224, 234, and 252 and multiplexers 222, 232 and 250). While, for purposes of illustration, the oscillator 260 is depicted as part of the transmitter module 202, those skilled in the art will understand that it could alternatively be part of the receiver module 204 or implemented as a common external clock operative to drive digital circuitry in both modules.

Thus, those skilled in the art will understand and appreciate that a single oscillator 260 can be employed to drive at least a portion of multiple frequency hopping local oscillators in a communications system 200 implemented in accordance with an aspect of the present invention. While FIG. 7 depicts the communications system as a transceiver (including both transmitter and receiver portions 202 and 204), a communications system could be implemented as including a transmitter or receiver that employs frequency synthesis in accordance with an aspect of the present invention. It is to be further appreciated that separate local oscillator systems employing one or more delta-sigma direct digital synthesizers can be implemented according to an aspect of the present invention.

Figure 9:
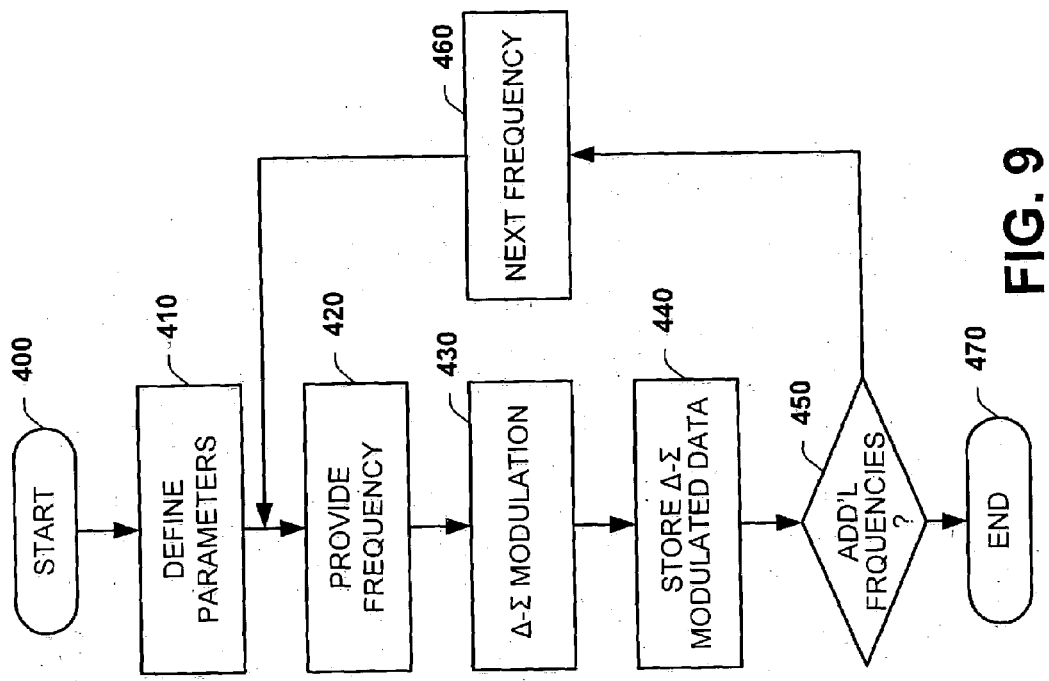
FIG. 9 is a flow diagram illustrating a methodology for programming memory with frequency patterns for use in frequency synthesis in accordance with an aspect of the present invention.
Figure 8:
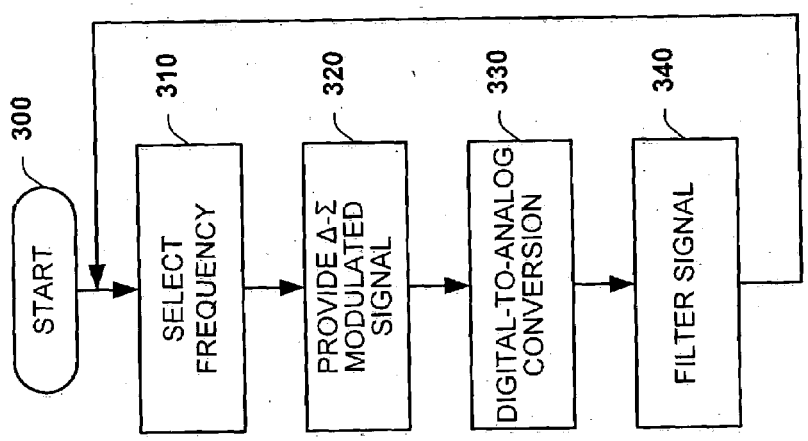
FIG. 8 is a flow diagram illustrating a frequency synthesis methodology in accordance with an aspect of the present invention.

In view of the examples shown and described above, a methodology for frequency synthesis in accordance with the present invention will be better appreciated with reference to the flow diagrams of FIGS. 8 and 9. While, for purposes of simplicity of explanation, the methodologies are shown and described as executing serially, it is to be understood and appreciated that the present invention is not limited by the order shown, as some aspects may, in accordance with the present invention, occur in different orders and/or concurrently from that shown and described herein. Moreover, not all features shown or described may be needed to implement a methodology in accordance with the present invention. Additionally, such methodologies can be implemented in hardware (e.g., one or more integrated circuits), software (e.g., running on a DSP or ASIC) or a combination of hardware and software.

FIG. 8 depicts methodology for digitally synthesizing frequencies in accordance with an aspect of the present invention. The methodology begins at 300, such as in connection with powering up a digital frequency synthesizer implementing the methodology. At power-up, variables can be initialized to their starting conditions and reference voltages set to their starting levels. At 310, during normal operation, a desired frequency is selected. The frequency selection can include identifying one of a plurality of frequencies in a corresponding range of frequencies. At 320, a delta-sigma modulated signal pattern is provided. As mentioned above, the delta-sigma modulated signal can be provided at a desired sample rate by a memory programmed to store delta-sigma modulated patterns associated with each of a plurality of desired frequencies. Alternatively, the delta-sigma modulated signal can be provided at 320 by a DSP or other signal generation device, which is delta-sigma modulated in real time to provide the delta-sigma modulated pattern for the selected frequency.

At 330, the delta-sigma modulated signal is converted to a corresponding analog signal. This conversion is implemented by a DAC that is operative to convert the data stream that comprises the delta-sigma modulated signal to the analog domain. If necessary, one or more multiplexers can be utilized to condition the signal to provide an appropriate number of bits in the data stream to facilitate its conversion to the analog domain. For example, one-bit digital to analog conversion can be implemented, which requires a one-bit input signal to the DAC. Multi-bit DACs also can be utilized. At 340, the analog signal is filtered to remove quantization noise and out-of-band frequency components inherent in the delta-sigma modulated signal (320). From 340 the methodology can return to 310 in which next frequency can be selected as part of a frequency hopping implementation. The methodology can be controlled to frequency hop at any desired rate, which can be fixed or variable.

FIG. 9 illustrates a methodology that can be utilized to program memory device to store signal patterns for use in a frequency synthesis methodology according to an aspect of the present invention. The methodology, for example, can be implemented in an integrated circuit programmed and/or configured to run an off-line process for programming the memory. Alternatively or additionally, the methodology can be implemented by a manufacturer or other user in a batch process prior to installation of the integrated circuit. The methodology begins at 400, which can include setting parameters to their starting values and initializing appropriate memory. At 410, parameters for the frequency synthesis are defined. Such parameters can include, for example, the bandwidth or frequency range for the desired set of frequencies, an incremental spacing for the set of the frequencies in the defined bandwidth, a duration tone length for each of the frequency patterns.

After the parameters for frequency synthesis have been defined at 410, the methodology proceeds to 420 in which a first frequency is provided. Frequency can be provided as an analog signal that is converted to a corresponding digital signal, such is provided by an analog frequency synthesizer. Alternatively, the frequency pattern can be provided by a DSP or other memory device programmed to provide a signal pattern at each of the desired frequencies. At 430, the signal pattern provided at 420 is delta-sigma modulated. The delta-sigma modulation includes noise shaping and quantization of the frequency signal to shift noise content to out-of-band frequencies as well as to quantize the data stream to a different number of bits (e.g., a lower number of bits at a possibly faster rate). At 440, the delta-sigma pattern is stored in the memory device. The pattern can be stored with an associated index value to facilitate retrieving the stored pattern, such as stored in a look-up table. Alternatively, the corresponding address location for the stored pattern can be assigned based on the application in which the frequency synthesis employing the patterns is to be implemented. For example, a count value from 1 to N can be assigned to access each respective stored pattern, where N denotes the number of frequencies to be supported.

At 450, a determination is made as to whether there are any additional frequencies needed in the defined frequency range. If additional frequencies exist, the methodology proceeds to 460 in which the next frequency is selected. Selection of the next frequency at 460 can be determined as a function of the selected interval for the selected frequency patterns. Those skilled in the art will understand and appreciate that the interval can be a fixed interval over the bandwidth or, alternatively, can be a variable interval over the bandwidth. From 460 the methodology returns to 420 in which the selected frequency is provided and processed accordingly.

If the determination at 450 is negative, indicating that delta-sigma frequency patterns have been stored for each of the desired frequencies or the available memory is full, the methodology proceeds to 460 in which it ends. As a result, the set of patterns stored at 440 can be utilized during normal operation of a frequency synthesis methodology (e.g., as in FIG. 8) to provide substantially pure frequencies for various applications as identified herein.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. For example, while the above description appears to describe the frequency patterns as being fixed, it will be understood and appreciated that variable frequencies also can be employed in accordance with an aspect of the present invention. Accordingly, the present invention is intended to embrace all such alterations, modifications and variations that fall within the spirit and scope of the appended claims.

What is claimed is:

1. A digital frequency synthesizer comprising:
   a frequency source that provides a selected one of a plurality of stored frequency patterns based on a frequency selection input;
   a digital-to-analog converter that receives a delta-sigma modulated signal associated with the selected one of the plurality of frequency patterns and converts the delta-sigma modulated signal to a corresponding analog signal; and
   a delta-sigma modulator coupled to provide the delta-sigma modulated signal to the digital-to-analog converter based on associated processing of the selected one of the frequency patterns.

2. A digital frequency synthesizer comprising:
   a frequency source that provides a selected one of a plurality of frequency patterns based on a frequency selection input;
   a digital-to-analog converter that receives a delta-sigma modulated signal associated with the selected one of the plurality of frequency patterns and converts the delta-sigma modulated signal to a corresponding analog signal; and
   a switching system coupled to receive the selected one of the frequency patterns as an M-bit signal and to provide an N-bit signal, where $M > N \geq 1$.

3. The synthesizer of claim 2, the frequency source further comprising memory that stores data for the plurality of frequency patterns, the memory providing the selected one of the plurality of frequency patterns in response to the frequency selection input.

4. The synthesizer of claim 3, the plurality of frequency patterns further comprising delta-sigma modulated patterns associated with the frequencies represented by the plurality of frequency patterns.

5. The synthesizer of claim 3, further comprising a frequency selector operative to select the selected one of the plurality of frequencies from the memory device for a desired frequency based on the selection input.

6. The synthesizer of claim 2, further comprising a delta-sigma modulator coupled to receive the N-bit signal, the delta-sigma modulator processing the N-bit signal to provide the delta-sigma modulated signal to the digital-to-analog converter.

7. The synthesizer of claim 2, the digital-to-analog converter further comprising a one-bit digital-to-analog converter.

8. A digital frequency synthesizer comprising:
   a frequency source that provides a selected one of a plurality of frequency patterns based on a frequency selection input;
   a digital-to-analog converter that receives a delta-sigma modulated signal associated with the selected one of the plurality of frequency patterns and converts the delta-sigma modulated signal to a corresponding analog signal; and
   the digital-to-analog converter providing the analog signal as a frequency hopping signal that hops between selected ones of the plurality of frequency patterns at a hop rate based on the selection input.

9. The synthesizer of claim 8, further comprising a filter coupled to mitigate noise in the analog signal provided by the digital-to-analog converter, at least some of the noise corresponding to quantization noise or noise that has been shifted to out-of-band frequencies to facilitate frequency hopping of the analog signal.

10. A communications system comprising:
    a digital frequency synthesizer comprising:
       a frequency source that provides a selected one of a plurality of frequency patterns based on a frequency selection input; and
       a digital-to-analog converter that receives a delta-sigma modulated signal associated with the selected one of the plurality of frequency patterns and converts the delta-sigma modulated signal to a corresponding analog signal; and
    a mixer coupled to receive a local oscillator signal at a carrier frequency based on the selection input, the local oscillator signal corresponding to a filtered representation of the analog signal provided by the digital-to-analog converter.

11. A communications system, comprising:
    a digital frequency synthesizer comprising:
       a frequency source that provides a selected one of a plurality of frequency patterns based on a frequency selection input; and
       a digital-to-analog converter that receives a delta-sigma modulated signal associated with the selected one of the plurality of frequency patterns and converts the delta-sigma modulated signal to a corresponding analog signal;
    a transmitter portion that includes the digital-to-analog converter, which is operative to convert a first delta sigma modulated signal associated with a first selected one of the plurality of frequency patterns to a corresponding analog signal;
    a receiver portion that includes a digital-to-analog converter operative to convert a second delta sigma modulated signal associated with a second selected one of the plurality of frequency patterns to a corresponding analog signal; and
    an oscillator that provides a clock signal for controlling at least part of the transmitter portion and at least part of the receiver portion.

12. A frequency hopping digital frequency synthesizer comprising:
    a frequency source that provides a selected one of a plurality of frequency patterns based on a selection input that changes at a hop rate;
    a digital-to-analog converter that receives a delta-sigma modulated signal associated with the selected one of the plurality of frequency patterns and converts a delta-sigma modulated signal to a corresponding analog signal; and a filter coupled to mitigate noise in the corresponding analog signal, at least some of the noise corresponding to quantization noise or noise that has been shifted to out-of-band frequencies.

13. The synthesizer of claim 12, digital-to-analog converter further comprising a one-bit digital-to-analog converter.

14. The synthesizer of claim 12, the frequency source further comprising a memory that stores data for the plurality of frequency patterns, the memory providing the selected one of the plurality of frequency patterns in response to the selection input.

15. The synthesizer of claim 12, further comprising a delta-sigma modulator coupled to process the selected one of the plurality of frequency patterns and to provide the delta-sigma modulated signal to the digital-to-analog converter.

16. The synthesizer of claim 15, the delta-sigma modulator comprising a plurality of delta-sigma modulator stages coupled to process different portions of the selected one of the plurality of frequency patterns in parallel.

17. A communications system comprising the synthesizer of claim 12, the communications system further comprising a mixer coupled to receive a local oscillator signal at a carrier frequency defined by the selection input, the local oscillator signal corresponding to a filtered version of the analog signal provided by the digital-to-analog converter.

18. A digital frequency synthesizer comprising:
  means for providing a digital representation of one of a plurality of frequency patterns based on a frequency selection signal that varies according to a hop rate, the plurality of frequency patterns representing at least two different respective frequencies;
  means for converting a delta-sigma modulated signal to a corresponding analog signal, the delta-sigma modulated signal being associated with the digital representation of one of the plurality of frequency patterns provided by the means for providing.

19. The synthesizer of claim 18, the means for providing further comprising means for storing data for the plurality of frequency patterns and for providing the selected one of the plurality of frequency patterns based on the frequency selection signal.

20. The synthesizer of claim 18, further comprising means for delta-sigma modulating an input signal corresponding to the digital representation of the one of the plurality of frequency patterns to provide the delta-sigma modulated signal to the means for converting.

21. The synthesizer of claim 18, further comprising means for filtering the analog signal to provide a filtered signal having reduced noise content relative to the analog signal.

22. A communications system comprising the synthesizer of claim 21, the communications system further comprising means for mixing a local oscillator signal corresponding to the filtered signal with another signal.

23. A communications system comprising the synthesizer of claim 18, the communications system further comprising:
  a transmitter portion that includes the means for converting, which operative to convert a first delta sigma modulated signal associated with a first selected one of the plurality of frequency patterns to a corresponding analog signal;
  a receiver portion that includes another means for converting a second delta sigma modulated signal associated with a second selected one of the plurality of frequency patterns to a corresponding analog signal; and
  means for providing an oscillator signal for controlling at least part of the transmitter portion and at least part of the receiver portion.

24. A method for synthesizing desired frequency signals, comprising:
  selecting one of a plurality of frequencies;
  providing a delta-sigma modulated signal associated with the selected one of the plurality of frequencies;
  converting the delta-sigma modulated signal to a corresponding analog signal; and
  varying the selection of the one of the plurality of frequencies at a hop rate, such that the frequency of the analog signal changes according to the hop rate.

25. The method of claim 24, further comprising filtering the analog signal to provide a filtered signal in which noise associated with delta-sigma modulation is mitigated.

26. The method of claim 24, further comprising programming memory to store digital representations of a plurality of frequency patterns for the plurality of frequencies.

* * * * *